(12) United States Patent
Harima et al.

(10) Patent No.: US 6,998,925 B2
(45) Date of Patent: *Feb. 14, 2006

(54) SURFACE-MOUNT CRYSTAL OSCILLATOR

(75) Inventors: Hidenori Harima, Saitama (JP);
Hiroaki Mizumura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 10/620,230

(22) Filed: Jul. 15, 2003

(65) Prior Publication Data

US 2004/0041640 A1 Mar. 4, 2004

(30) Foreign Application Priority Data

Jul. 15, 2002 (JP) .............................. 2002-206020

(51) Int. Cl.
*H03B 1/00* (2006.01)
(52) U.S. Cl. ..................... 331/68; 331/108 D; 310/348
(58) Field of Classification Search ................ 331/158, 331/68, 116 R, 117 R, 108 D; 361/752, 361/730; 257/666, 698; 310/348
See application file for complete search history.

(56) References Cited

U.S. PATENT DOCUMENTS

| 6,720,837 | B1 * | 4/2004 | Moriya et al. .............. 331/158 |
| 6,778,029 | B1 * | 8/2004 | Mizusawa ..................... 331/68 |
| 2003/0210102 | A1 * | 11/2003 | Harima et al. .............. 331/158 |
| 2004/0036547 | A1 * | 2/2004 | Harima ........................ 331/158 |
| 2004/0085147 | A1 * | 5/2004 | Harima et al. .............. 331/158 |
| 2004/0095199 | A1 * | 5/2004 | Ono et al. ................... 331/158 |

\* cited by examiner

*Primary Examiner*—Joseph Chang
(74) *Attorney, Agent, or Firm*—Katten Muchin Rosenman LLP

(57) ABSTRACT

A surface-mount crystal oscillator includes a quartz crystal unit, a mounting substrate on which an IC (Integrated Circuit) chip is mounted and which is bonded to the rear surface of the crystal unit, and an electronic components which is mounted on one end of the surface of the mounting substrate on which the crystal unit is bonded. The crystal unit includes a planar substrate, a quartz crystal blank held on one principal surface of the planar substrate, a metal film formed along the outer periphery of the principal surface, and a concave metal cover having an open-ended face. In the crystal unit, the open-ended face of the metal cover is brazed to the metal film, whereby the crystal blank is hermetically sealed between the metal cover and the planar substrate.

11 Claims, 4 Drawing Sheets

SURFACE-MOUNT CRYSTAL OSCILLATOR

BACKGROUND OF THE INVENTION

1. Field of the Invention

The present invention relates to a quartz crystal oscillator for supplying an oscillating frequency signal and which includes a quartz crystal unit and an IC (Integrated Circuit) chip that together with the crystal unit forms an oscillation circuit; and more particularly to a surface-mount crystal oscillator which is suitable for miniaturization wherein a mounting substrate, on which an IC chip is provided, is bonded to the rear surface of a crystal unit.

2. Description of the Related Art

Surface-mount crystal oscillators, and in particular, surface-mount temperature-compensated crystal oscillators (TCXOs) feature light weight, compact size, and an oscillation frequency having superior stability, and these devices are therefore widely used in communication equipment such as portable telephones which are used in a mobile environment. As one type of surface-mount crystal oscillator, there is a bonded-type surface-mount crystal oscillator in which a mounting substrate, on which an IC chip constituting an oscillation circuit has been mounted, is installed on the rear surface of a crystal unit.

FIGS. 1A and 1B show an example of the construction of this type of the conventional surface-mount crystal oscillator, and FIGS. 2A and 2B show a crystal unit that is used in this surface-mount crystal oscillator. The surface-mount crystal oscillator is provided with crystal unit 1 and mounting substrate 2. Crystal unit 1 is constructed by accommodating quartz crystal blank 3 within casing 4 and covering the opening of casing 4 by metal cover 5.

Casing 4 is shaped with a depression or recess formed in one of its principle surfaces, and is constructed from laminated ceramic in which bottom wall 4a and frame walls 4b are stacked together. Bottom wall 4a is a substantially rectangular planar shape, and frame walls 4b are formed as a substantially rectangular frame shape, whereby a substantially rectangular depression is formed in casing 4. As shown in FIG. 2A, a pair of terminal electrodes 6 is formed on the bottom surface of the depression of casing 4, i.e., the exposed surface of bottom wall 4a.

Crystal blank 3 is, for example, a substantially rectangular AT-cut quartz crystal blank, and although not shown here, excitation electrodes are formed opposite each other on the two principal surfaces of the crystal blank. In addition, extension electrodes are formed on both sides of one end of crystal blank 3 to extend from the excitation electrodes. Both sides of one end of crystal blank 3 from which the extension electrodes extend are secured to terminal electrodes 6 on the bottom surface of the depression of casing 4 by means of conductive adhesive 12. Crystal blank 3 is thus held horizontally and connected electrically and mechanically to casing 4.

A pair of connection terminals 7a are provided at diagonally opposite corners on the outer side of the bottom surface of casing 4. These connection terminals 7a are connected to respective terminal electrodes 6 by way of conductive paths formed in casing 4. In addition, ground terminals 7b are provided at the other diagonally opposite corners on the outer side of the bottom surface of casing 4. Ground terminals 7b are electrically connected to metal cover 5. Typically, metal cover 5 is bonded to casing 4 by providing a metal ring on the upper surface of frame walls 4b and then seam welding metal cover 5 to this metal ring.

As with casing 4, mounting substrate 2 is composed of laminated ceramic and has a depression or recess formed in one of its principal surfaces. The planar outer dimensions of mounting substrate 2 are greater than the planar outer dimensions of crystal unit 1, and in particular, are set to allow a space at one longitudinal end of mounting substrate 2 that is not covered by crystal unit 1 when crystal unit 1 is bonded to mounting substrate 2. In addition, connection terminals 8a which correspond to connection terminals 7a of crystal unit 1 and ground terminals 8b which correspond to ground terminals 7b of crystal unit 1 are provided on the surface of mounting substrate 2 which is bonded to crystal unit 1, i.e., on the surface in which the depression is not formed. Then, for example, two chip capacitors 9 are mounted in the space at the longitudinal end of mounting substrate 2.

Mounting terminals 10 including terminals such as a power supply terminal, a ground terminal, an output terminal, and an AFC (Auto Frequency Control) terminal are provided on the upper surface of frame part 2a which surrounds the depression of mounting substrate 2. IC chip 11 is secured inside the depression, by the way of, for example, ultrasonic thermocompression using bumps. An oscillation circuit which connects to crystal unit 1 and a temperature compensation mechanism for effecting temperature compensation of the oscillator frequency of the oscillation circuit are integrated on IC chip 11. Mounting terminals 10 are electrically connected to the respective terminals of IC chip 11. IC chip 11 is also electrically connected to connection terminals 8a and ground terminals 8b.

Mounting substrate 2 is installed on the rear surface of crystal unit 1 by bonding connection terminals 7a and ground terminals 7b of crystal unit 1 to connection terminals 8a and ground terminals 8b of mounting substrate 2 by means of, for example, solder.

As chip capacitors 9, a variety of large-capacitance capacitors which are difficult to incorporate inside IC chip 11 may be arranged, including bypass capacitors between power supply and ground, capacitors for coupling with a succeeding stage, or CR filter capacitors for suppressing noise which is produced by the temperature compensation mechanism.

In a surface-mount crystal oscillator of the above-described construction, however, there is the problem that, with the development of ever-smaller devices, the space for mounting chip capacitors 9 becomes difficult to maintain, such as in a case in which the planar outer dimensions of the oscillator are reduced to a size of 3.2 mm×2.5 mm.

This problem does not arise if crystal unit 1 becomes correspondingly smaller with the decrease in the planar outer dimensions. Decreasing the size of crystal unit 1 entails a choice between either correspondingly reducing the outer dimensions of crystal blank 3 or leaving the size of crystal blank 3 unchanged and increasing the ratio of the inside volume of casing 4 to the outer dimensions of the crystal oscillator. However, since the oscillation characteristics of a crystal blank improve with the increase in the outer dimensions of the crystal blank, decreasing the outer dimension of crystal blank 3 has an adverse effect on the oscillation characteristics of crystal blank and thus results in design problems. More specifically, decreasing the dimensions of crystal blank 3 brings about an increase in the crystal impedance (CI) of crystal blank 3 and the occurrence of spurious oscillation. On the other hand, increasing the ratio of the inside volume of casing 4 necessitates a corresponding decrease of the thickness of frame walls 4b. Frame walls 4b are composed of ceramic, and reducing the thickness not only reduces strength, but also raises problems in fabrication. Frame walls 4b must maintain a particular fixed thickness. Thus, in either case, reducing the size of crystal unit 1 is problematic, and a reduction of the outer dimensions of mounting substrate 2 thus prevents mounting of chip capacitors 9.

SUMMARY OF THE INVENTION

It is an object of the present invention to provide a compact surface-mount crystal oscillator in which the crystal unit is reduced in size to allow mounting of electronic components.

The object of the present invention is achieved by a crystal oscillator for surface mounting which includes: a crystal unit, a mounting substrate on which an IC chip is mounted and which is bonded to the rear surface of the crystal unit, and an electronic component which is mounted on one end of the surface of the mounting substrate on which the crystal unit is bonded; wherein the crystal unit includes: a planar substrate, a crystal blank secured to one principal surface of the planar substrate, a metal film formed along the outer periphery surrounding the principal surface, and a concave metal cover having an open-ended face; wherein the open-ended face is bonded to the metal film by brazing to hermetically seal the crystal blank between the metal cover and the planar substrate.

Because the thickness of the metal cover can be made smaller than the thickness of the frame walls of laminated ceramic, the size of the crystal unit can be reduced while maintaining the size of the crystal blank unchanged, whereby a compact surface-mount crystal oscillator can be constructed which maintains space for mounting electronic components on the mounting substrate.

DETAILED DESCRIPTION OF THE INVENTION

Figure 3:
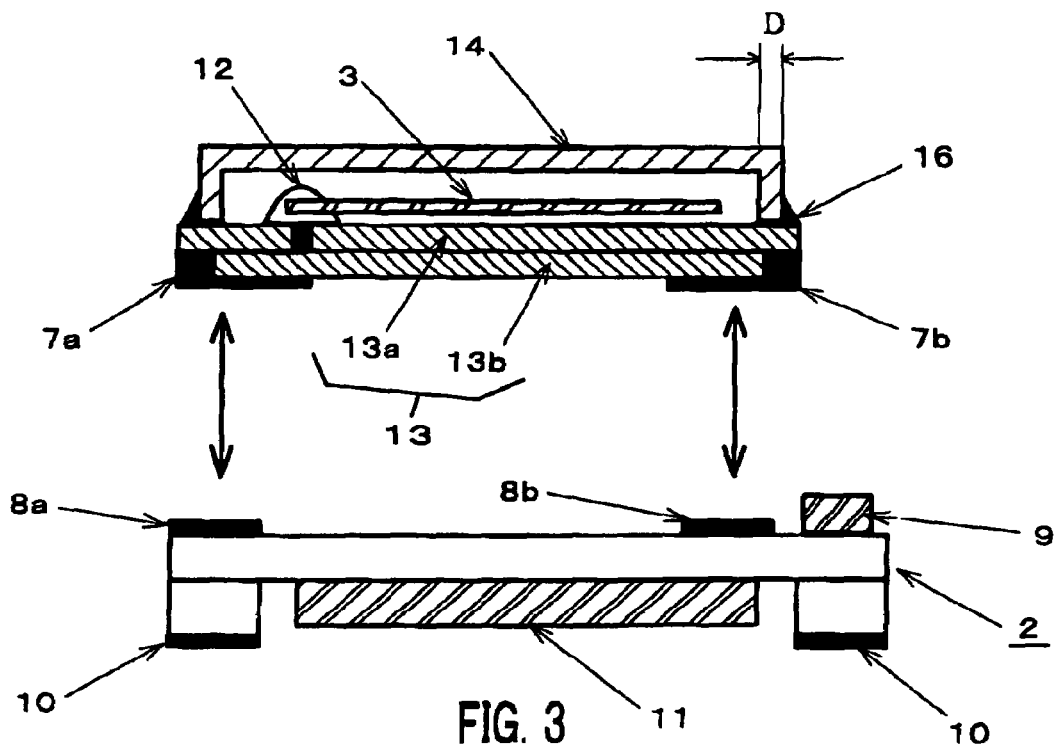
FIG. 3 is an exploded sectional view illustrating the surface-mount crystal oscillator according to an embodiment of the present invention.
Figure 4:
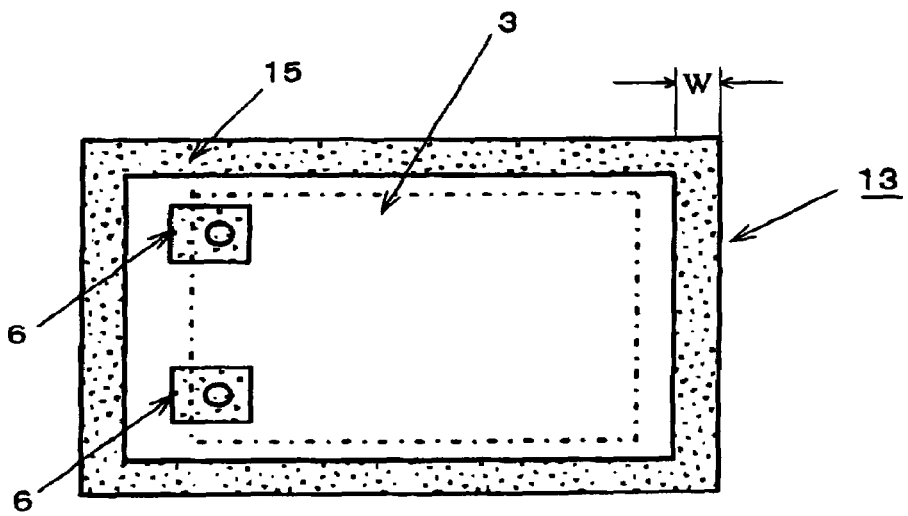
FIG. 4 is a plan view illustrating the crystal unit used in the surface-mount crystal oscillator which is shown in FIG. 3, and shows the crystal unit with the cover removed.

In FIGS. 3 and 4, which show a surface-mount crystal oscillator according to a preferable embodiment of the present invention, constituent elements which are identical to elements in the oscillator shown in FIGS. 1A, 1B, 2A, and 2B are identified by the same reference numerals, and redundant detailed explanation regarding these elements is not repeated here.

As previously described, in the surface-mount crystal oscillator according to the present embodiment, mounting substrate 2 which incorporates IC (Integrated Circuit) chip 11 is bonded to the rear surface of quartz crystal unit 1, and chip capacitors 9 are mounted on one end of mounting substrate 2. Crystal unit 1 used in this construction is made up from planar substrate 13, concave metal cover 14 which is provided to cover planar substrate 13, and quartz crystal blank 3 which is sealed between planar substrate 13 and metal cover 14. As in the previously described crystal oscillator of the prior art, a substantially rectangular AT-cut quartz crystal blank may be employed as crystal blank 3.

Planar substrate 13 is formed from laminated ceramic composed of first layer 13a and second layer 13b. A pair of terminal electrodes 6 for connecting to both sides of the end of crystal blank 3 from which the extension electrodes extend are provided on one of the surfaces of planar substrate 13, i.e., on the surface of first layer 13a. In addition, metal film 15 surrounding the outer periphery of first layer 13a is formed on the surface of first layer 13a. The width W of metal film 15 is, for example, 0.15 mm. Terminal electrodes 6 and metal film 15 are simultaneously formed with planar substrate 13 when sintering planar substrate 13, which is composed of laminated ceramic. Frame-shaped brazing filler metal 16, which is, for example, a gold-tin (AuSn) eutectic alloy, is bonded to metal film 15.

A pair of connection terminals 7a are provided at both ends of a one diagonal of the outside bottom surface of second layer 13b of planar substrate 13. Ground terminals 7b are provided at both ends of the other diagonal of the outside bottom surface of second layer 13b. These connection terminals 7a and ground terminals 7b extend to the side surface of second layer 13b. Connection terminals 7a electrically connect to terminal electrodes 6 by way of through-holes which are provided in first layer 13a and second layer 13b. By using conductive adhesive 12 to secure both sides of one end of crystal blank 3, from which extension electrodes extend, to terminal electrodes 6, crystal blank 3 is held horizontally and is electrically and mechanically connected to planar substrate 13.

Metal cover 14 is composed of, for example, kovar, nickel silver or the like and is formed in a concave form by a process such as deep drawing. More specifically, metal cover 14 has a substantially rectangular bottom wall and side walls which extend from and substantially perpendicular to the bottom wall, these side walls thus forming a shape having an open-ended face. The planar outer dimensions of metal cover 14 are smaller than the planar outer dimensions of planar substrate 13. The inside dimensions of the open-ended face of metal cover 14 are substantially identical to the inside dimensions of metal film 15. In addition, the thickness of metal cover 14, and in particular, the thickness D of the side-wall portions is less than thickness W of metal film 15. This metal cover 14 is electrically connected to ground terminals 7b.

Figure 1A:
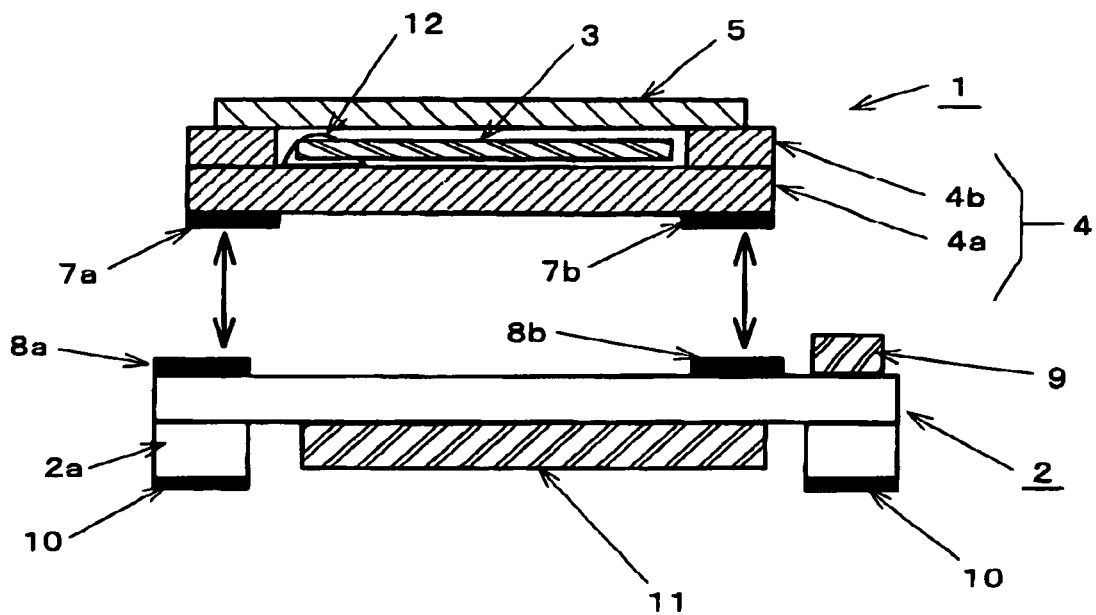
FIG. 1A is an exploded sectional view illustrating a conventional surface-mount crystal oscillator.
Figure 1B:
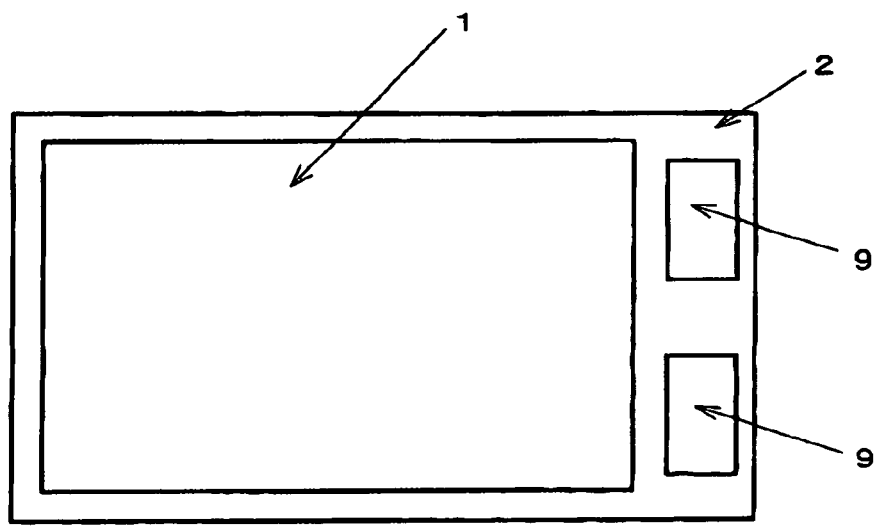
FIG. 1B is a plan view of the surface-mount crystal oscillator shown in FIG. 1A.
Figure 2A:
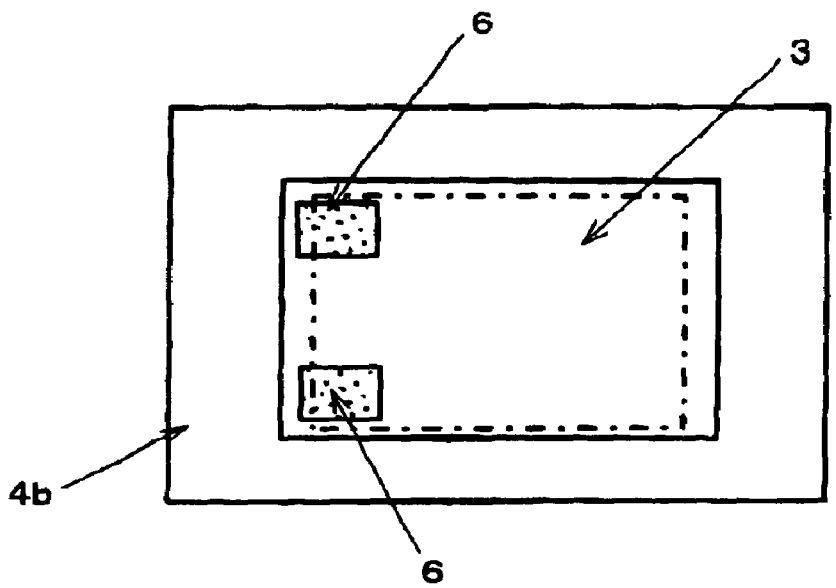
FIG. 2A is plan view illustrating the crystal unit used in the surface-mount crystal oscillator which is shown in FIG. 1A and shows the crystal unit with the cover removed.
Figure 2B:
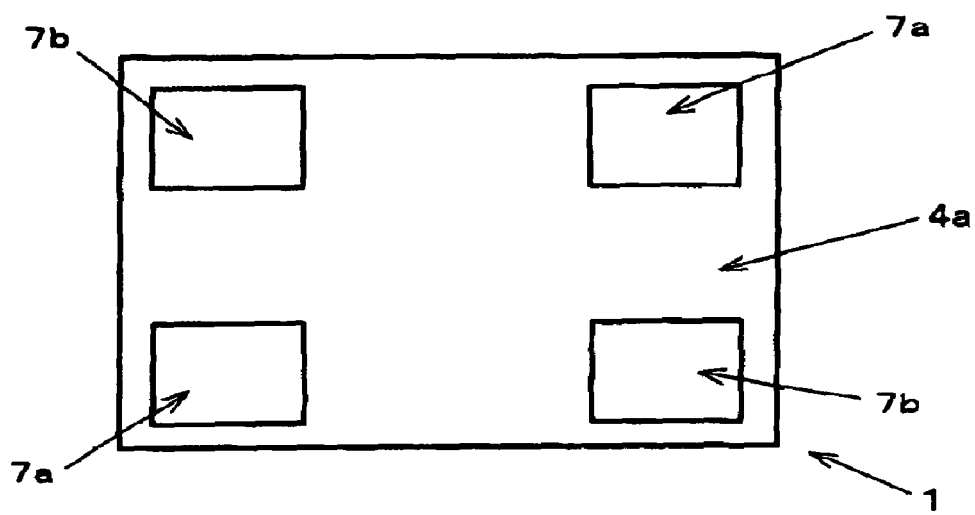
FIG. 2B is a view of the rear surface of the crystal unit shown in FIG. 2A.

Mounting substrate 2 used in this embodiment is identical to the mounting substrate used in the surface-mount crystal oscillator shown in FIGS. 1A, 1B, 2A, and 2B. When crystal unit 1 of this embodiment is bonded to mounting substrate 2, an area which is not covered by crystal unit 1, i.e., a space, is formed on one longitudinal end of mounting substrate 2, and two chip capacitors 9 are mounted in this space in the similar manner as shown in FIG. 1B. As previously described, the bonding of crystal unit 1 and mounting substrate 2 is realized by using solder or the like to join connection terminals 7a and ground terminals 7b of crystal unit 1 to connection terminals 8a and ground terminals 8b of mounting substrate 2.

When assembling this surface-mount crystal oscillator, crystal unit 1 is first formed and crystal unit 1 and mounting substrate 2 are then bonded together. When fabricating crystal unit 1, both sides of one end of crystal blank 3 are secured to planar substrate 13 by conductive adhesive 12, following which the open-ended face of metal cover 14 is positioned inside the outer edges of planar substrate 13 to contact brazing filler metal 16, and then heated. The application of heat melts brazing filler metal 16, forms a fillet on the outer peripheral surface, and bonds the open-ended face of metal cover 14 to planar substrate 13 to hermetically seal crystal blank 3.

In this construction, planar substrate 13 and metal cover 14 constitute a container which accommodates crystal blank 3 in crystal unit 1. The thickness of the frame walls in the casing which was composed of laminated ceramic in the prior art was, for example, 0.35 mm, but the use of metal cover 14 in the present embodiment enables a reduction in the thickness D of the surrounding walls compared to the example of the prior art. For example, the use of metal cover 14 enables reduction of thickness D of the surrounding walls to 0.08 mm. Thus, as a result of adopting the present embodiment, the inside volume of the container which accommodates crystal blank 3 can be maintained without alteration and crystal blank 3 of the same size as the prior art can be used despite reduction of the outer planar area of crystal unit 1.

Thus, despite reduction of the size of mounting substrate 2, the use of the present embodiment allows the size of crystal unit 1 to be reduced while suppressing increase in CI and the occurrence of spurious oscillation, and further, allows space for mounting chip capacitors 9 to be secured on one end of mounting substrate 2. A surface-mount crystal oscillator can be obtained that allows mounting of chip capacitors 9 and that features both compact size and high added value.

Figure 5:
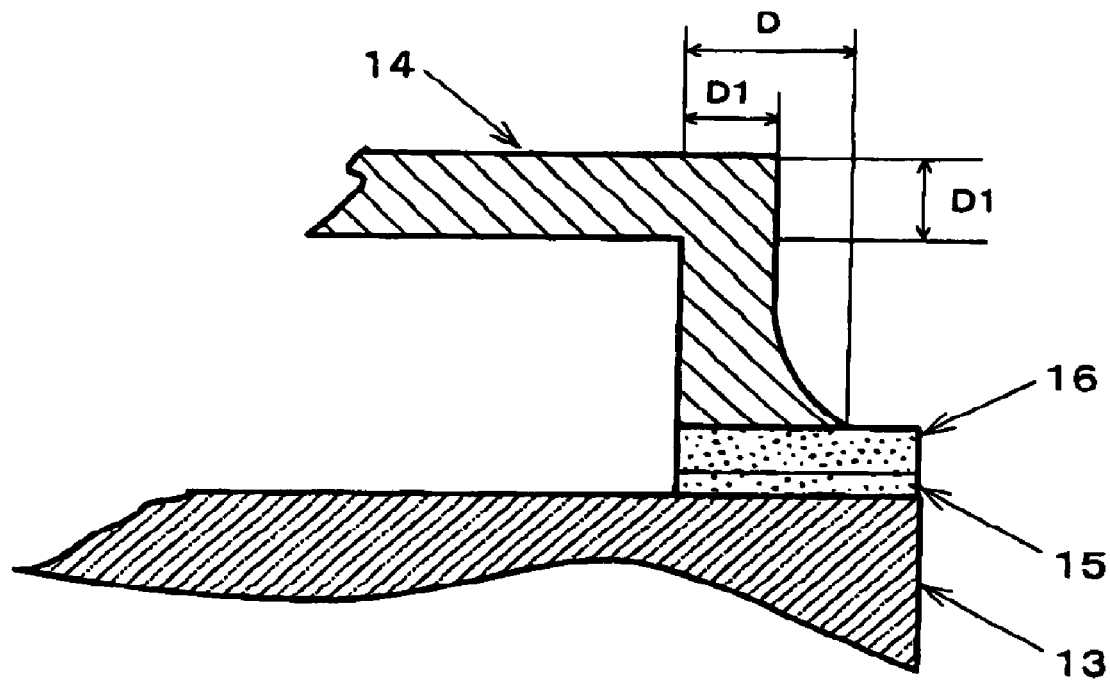
FIG. 5 is an enlarged partial sectional view illustrating the crystal unit used in the surface-mount crystal oscillator of another embodiment of the present invention.

Explanation next regards a surface-mount crystal oscillator according to another embodiment of the present invention. In the above-described embodiment, a case was described in which the thickness of metal cover 14 of crystal unit 1 was substantially the same throughout, but the thickness of metal cover 14 may also vary at different positions as shown in FIG. 5. In the crystal unit shown in FIG. 5, a process of crushing the outer edge of the open-ended face of metal cover 14 produces a flared shape in which the thickness increases toward the edge. In this case, the thickness of the portion of increased thickness is on the same order as thickness D of the metal cover in the above-described embodiment, and the thickness D1 of the main body of metal cover 14 is smaller than thickness D of the metal cover in the above-described embodiment. By adopting this form, the length, i.e., a so-called seal path, of the bonding surface of the open-ended face of metal cover 14 and metal film 15 can be maintained unchanged from the above-described embodiment and a hermetic seal can be reliably achieved. In addition, setting the thickness of metal cover 14 to a thickness D1 that is less than thickness D enables a surface-mount crystal oscillator to be obtained in which the height dimension is less than in the above-described embodiment, and miniaturization in the direction of height of the crystal oscillator can therefore be advanced.

In the above embodiments, an example was described in which two chip capacitors 9 were mounted in the space at one end of mounting substrate 2, but the number of mounted chip capacitors is not limited to two. For example, just one capacitor may be mounted. Further, the present invention does not limit the components which can be mounted in this space to chip capacitors, and any chip-type electronic component such as inductors and thermistors can be mounted as necessary.

The use of laminated ceramic of two-layer structure as planar substrate 13 improves the degree of hermetic sealing of the casing of the crystal unit, but ceramic of single-layer structure may be employed, the terminal electrodes and connection electrodes may be electrically connected by way of, for example, via-holes, and a dielectric film may be printed over the via-holes to ensure an airtight seal in the via-hole portions. In this case, the height of the crystal oscillator may be further reduced.

What is claimed is:

1. A crystal oscillator for surface mounting, comprising:
   a crystal unit;
   a mounting substrate on which an IC chip is mounted and which is bonded to a rear surface of said crystal unit; and
   an electronic component which is mounted on one end of a surface of said mounting substrate on which said crystal unit is bonded;
   wherein said crystal unit comprises:
   a planar substrate;
   a crystal blank secured to one principal surface of said planar substrate;
   a metal film formed along an outer periphery surrounding said principal surface; and
   a concave metal cover having an open-ended face;
   wherein said open-ended face is bonded to said metal film by brazing to hermetically seal said crystal blank between said metal cover and said planar substrate.

2. The crystal oscillator according to claim 1, wherein first connection terminals for electrically connecting with said crystal blank are formed on the other principal surface of said planar substrate, and said first connection terminals are electrically connected to second connection terminals formed on the surface of said mounting substrate upon which said crystal unit is bonded.

3. The crystal oscillator according to claim 1, wherein said planar substrate is composed of laminated ceramic.

4. The crystal oscillator according to claim 3, wherein said first connection terminals are electrically connected to said crystal blank by way of through-holes formed in said laminated ceramic and a conductive adhesive.

5. The crystal oscillator according to claim 1, wherein planar outer dimensions of said metal cover is smaller than planar outer dimensions of said planar substrate, and a thickness of said metal cover at said open-ended face is smaller than a width of said metal film.

6. The crystal oscillator according to claim 1, wherein said metal cover has a continuously increasing thickness toward an outer periphery on said open end face.

7. The crystal oscillator according to claim 1, wherein said planar substrate has a planar outer form which is substantially rectangular.

8. The crystal oscillator according to claim 7, wherein said metal cover has a substantially rectangular bottom wall and side walls extending substantially perpendicular to, said bottom wall, said side walls thus forming said open-ended face.

9. The crystal oscillator according to claim 1, wherein a depression is formed on a surface of said mounting substrate which is opposite the surface on which said crystal unit is bonded, and an IC chip is mounted inside said depression.

10. The crystal oscillator according to claim 1, wherein said IC chip includes an oscillation circuit electrically connected to said crystal unit.

11. The crystal oscillator according to claim 1, wherein said electronic component is a chip capacitor.

* * * * *